United States Patent [19]
Hageman et al.

[11] Patent Number: 5,735,027
[45] Date of Patent: Apr. 7, 1998

[54] METHOD OF MANUFACTURING A MULTILAYER CERAMIC ELECTRONIC COMPONENT

[75] Inventors: Hans-Jürgen Hageman, Aachen; Hans-Jürgen Lydtin, Stolberg; Arnd Ritz, Heinsberg, all of Germany; Jacques Warnier, Eijsden, Netherlands

[73] Assignee: U.S. Philips Corporation, New York, N.Y.

[21] Appl. No.: 769,896

[22] Filed: Nov. 13, 1996

[30] Foreign Application Priority Data

Nov. 14, 1995 [DE] Germany .................. 195 42 365.8

[51] Int. Cl.$^6$ .................................................. H01L 41/22
[52] U.S. Cl. ...................... 29/25.35; 29/25.42; 29/854
[58] Field of Search ........................ 29/25.42, 25.35, 29/854; 361/308.1, 309, 304; 320/365, 366

[56] References Cited

U.S. PATENT DOCUMENTS 5,347,696  9/1994  Willer et al. ....................... 29/25.42
5,597,494  1/1997  Kohno et al. ..................... 29/25.42 X

FOREIGN PATENT DOCUMENTS

0606607A1  7/1994  European Pat. Off. ......... H01G 4/30
4410504A1  9/1994  Germany .................. H01G 4/12

*Primary Examiner*—Carl E. Hall
*Attorney, Agent, or Firm*—Norman N. Spain

[57] ABSTRACT

A method of manufacturing a multilayer ceramic electronic component which comprises alternately conductive layers and dielectric layers, and in which successive, conductive layers are made alternately from two different electrode materials and extend up to the surfaces of all four side faces of the substrate, in which method, an end face of the stack of layers is immersed in an electrolytic solution and the least noble electrode material of the two electrode materials is electrochemically dissolved out, the resultant cavities are filled with a curable monomer, the noblest one of the two electrode materials is exposed by removing the polymeryzate formed, and a potential is applied to said electrode material, which is so high as to enable said noble electrode material at the other end face of the stack to be electrochemically dissolved out, the resultant cavities at the other end face are filled with a curable monomer, and outer electrodes are provided on opposite sides of the stack.

13 Claims, 1 Drawing Sheet

METHOD OF MANUFACTURING A MULTILAYER CERAMIC ELECTRONIC COMPONENT

BACKGROUND OF THE INVENTION

The invention relates to a method of manufacturing a multilayer ceramic electronic component, which comprises alternately conductive layers and dielectric layers, and in which successive, conductive layers are made alternately from two different electrode materials.

It is known that passive multilayer components and integrated passive multilayer assemblies, such as ceramic multilayer capacitors, are necessary for many different applications. In the following, a method of manufacturing such a ceramic electronic component is described for a multilayer capacitor.

In a conventional method of manufacturing a customary multilayer capacitor, use is often made of a three-step process. In the first process step, a continuous casting process is used to manufacture binder-containing, ceramic green foils from a binder-containing suspension of fine-grained, ceramic powders. The suspension is continuously provided on a conveyor belt in the form of a thin layer, whereafter it is dried in a tunnel furnace. The organic binder dissolved in the solution dries on the surface of the dispersed powder particles and combines them to form flexible, porous foils. Such foils may be composed, for example, of $BaTiO_3$, and their thickness generally ranges from 25 to 50 μm. To manufacture capacitors, these green foils are subsequently provided with electrodes in a screen-printing process in which a metal paste is used. In this process, the inner electrodes formed by said metallization are printed in such a manner that only every second inner-electrode layer bounds on the edges of the foil capacitor. The intermediate metal layer does not extend up to the edge. In this manner, only every second inner electrode is contacted by outer electrodes provided on the edges. The green foil forms the dielectric.

In this method, however, it is difficult to accurately regulate the interstitial areas between the inner electrodes and the outer electrodes, which must not be electrically connected to the inner electrodes. As the inner electrodes are formed by printing the conductive paste onto the ceramic green foil, the peripheral regions of these electrodes cannot be accurately defined due to distortions during screen printing, stacking and pressing. To preclude electric connection between the inner electrode and the outer electrode, it is necessary, for safety, to increase the interspace between said electrodes; consequently, further miniaturization of the multilayer capacitor becomes impossible. In the field of ceramic multilayer devices ("Ceramic Multilayer Devices"= CMD), the aim is to reduce the size, while the functionality remains unchanged, to integrate combined electrical functions of capacitors, resistors and inductive resistors into a monolithic component, as well as to attain higher specific capacitances in ceramic multilayer capacitors ("Ceramic Multilayer Capacitors"=CMC), to use surface mounted devices ("Surface Mounted Devices"=SMD) and to further develop the manufacturing techniques in order to mass-produce reliable electronic components in a cost-effective way.

In multilayer capacitors (CMC) the most important quality characteristic as regards miniaturization is the value of the capacitance per volume. Since the capacitance of a multilayer capacitor is proportional to $n\epsilon/d$, a reduction of the layer thickness of the dielectric causes the capacitance per volume to increase proportionally to $\epsilon/d^2$, if the entire volume of the capacitor is dielectrically active. However, this dielectrically active volume decreases with miniaturization, because, hitherto, the thickness of the electrode layers could not be reduced in the same degree as the thickness of the dielectric and because geometric tolerances of the manufacturing process did not allow the width of the peripheral regions which are not provided with inner electrodes to be reduced to below 200 to 300 μm. The metal electrodes and the peripheral regions take up a substantial part of the overall volume of the ceramic multilayer capacitor, however, they do not contribute to the capacitance of this capacitor, i.e. miniaturization of said capacitor by means of conventional techniques will inevitably lead to an increase of the dead volume of the ceramic multilayer capacitors, thereby limiting, in principle, the increase in volume capacitance and the miniaturization of the capacitor. A further very important problem is that the absolute positioning of the individual small components (as small as $0.5 \times 1$ mm$^2$) on the large multilayer plates is subject to many errors and inaccuracies, for example distortions during screen printing, dislocations during stacking and printing as well as thermal influences.

In the conventional method of manufacturing multilayer capacitors, the following individual process steps are carried out:

Foils are cast or drawn from suitable ceramic suspensions, which foils comprise the future ceramic dielectric in powder form together with small quantities of an organic binder. These foils typically have a thickness in the range from 20 to 100 μm, a width up to 50 cm and a length up to several hundred meters. A metal paste, which serves as the starting material for the inner electrodes, is screen printed onto the foils which are subsequently stacked. A stack comprises the preforms for thousands or even ten thousands of multilayer capacitors. The stacks are laminated by applying high axial pressures. The multilayer plates thus formed, which often have dimensions of $100 \times 100$ mm$^2$, are divided into individual multilayer capacitor blanks by means of suitable mechanical operations such as cutting or breaking. An important condition to be met is that the tiny electrode patterns for the inner electrodes of the individual multilayer capacitors are preformed on the printed foil with the proper dimensions and the proper distances between them, and that they are staggered relative to each other on two successive layers, in such a manner that after the division into individual components, the contact points of the electrodes are situated alternately on the "right" or on the "left", so that the individual capacitor layers can be connected in parallel, as desired. A particular factor to be taken into account when choosing a material and in the manufacturing process, is the necessary, high dielectric strength of the dielectric layers and the complete absence of faults in the layers over surface areas up to several hundred mm$^2$.

Although the known methods enable multilayer capacitors to be manufactured in large quantities and at low cost, these methods have the disadvantage that, owing to the powder technology used, the materials used for the dielectric and conductive layers must meet the conditions of the sintering process. As a result, the material systems which can be used are limited.

Particularly in the manufacturing process, the predetermined geometry, i.e. relatively thick layers, is converted to, ultimately, relatively thin layers as a result of pressing, drying, binder burn-out and sintering. This leads to problems, which are caused by creep of the material, displacements and inhomogeneous shrinkage within the layer stack. The accurate division into individual capacitors poses another problem. Consequently, methods for improving the manufacture of multilayer capacitors are proposed continually.

For example, in European Patent Application 606 607, a description is given of the manufacture of a multilayer capacitor, in which a substrate is provided with a laminate which comprises alternately conductive layers and dielectric layers, successive conductive layers being made alternately of one of two different materials which can be selectively etched relative to each other. However, this method is used specifically for the manufacture of multilayer capacitors for IC applications and requires time-consuming masking and etching steps which must be carried out throughout the thickness of the stack.

In German Offenlegungsschrift 44 10 504, a description is given of a method of manufacturing a multilayer ceramic electronic component with an improved construction of the inner electrodes and of the proper insulation between inner electrodes and outer electrodes, which method requires the dielectrics and the electrodes to be accurately stacked to ensure that every second inner electrode does not extend as far as the surface of the body. However, in the manufacture of a multilayer ceramic electronic component by means of a thin-film process, such a pre-structuring step is very time consuming.

SUMMARY OF THE INVENTION

Therefore, it is an object of the invention to provide a method in which pre-structuring of the inner electrodes is no longer required, and in which the structure-providing screen-printing process, including drying, binder burn-out and sintering, is no longer necessary, so that a much simpler and better manufacture of multilayer capacitors is achieved.

This object is achieved by a method of manufacturing a multilayer ceramic electronic component which comprises alternately conductive layers and dielectric layers, and in which successive, conductive layers are made alternately from two different electrode materials and extend up to the surfaces of all four side faces, in which method first, an end face of the stack of layers is immersed in an electrolytic solution and the least noble electrode material of the two electrode materials is electrochemically dissolved out, the resultant cavities are filled with a curable monomer, the noblest one of the two electrode materials is exposed by removing the polymerizate formed, and a potential is applied to said electrode material, which is so high as to enable said electrode material at the other end face of the stack to be electrochemically dissolved out in an electrolytic solution, the resultant cavities at the other end face are filled with a curable monomer, and outer electrodes are provided on opposite sides of the stack.

BRIEF DESCRIPTION OF THE INVENTION

The sole FIGURE in the drawing is a cross-sectional view of a stack of layers manufactured in accordance with the invention.

DETAILED DESCRIPTION OF THE INVENTION

Figure 1:
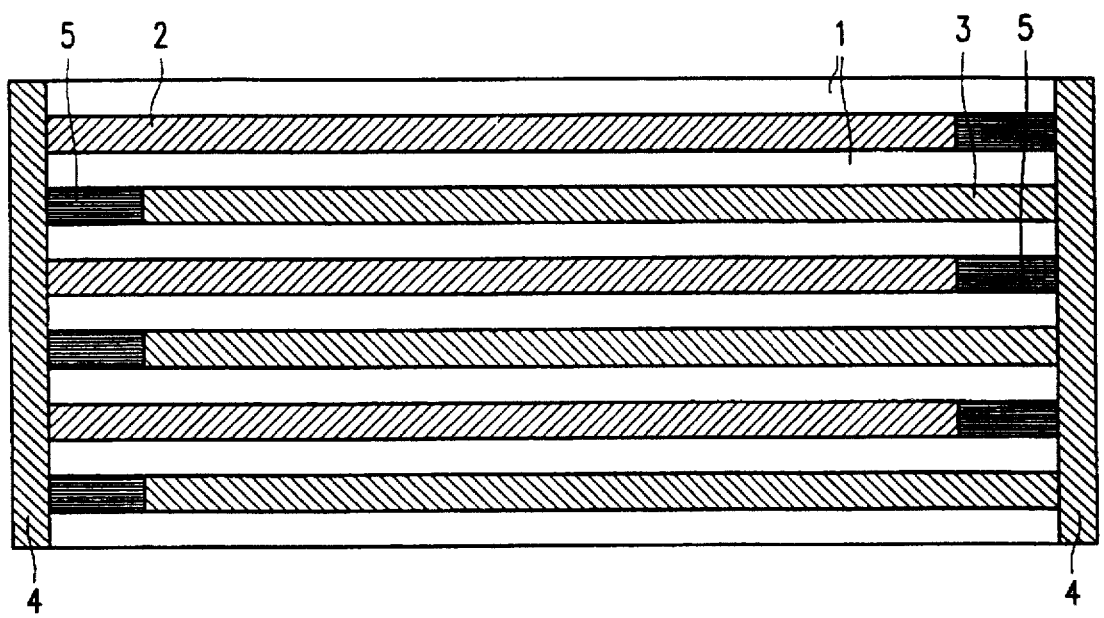

These and other aspects of the invention will be apparent from and elucidated with reference to the embodiments described hereinafter and the figure of the drawing; the sole FIGURE of which shows the stack of layers manufactured in accordance with the invention in which dielectric layers 1 and conductive layers of electrode materials A2 and B3 are alternately provided. The conductive layers are closed, alternately on the "right-hand side" or on the "left-hand side" by means of a drop of a polymeric material 5, which precludes electric connection between said layers and the outer electrode 4.

Consequently, the stacking order of the stack of layers manufactured in accordance with the invention, i.e. dielectric—electrode material A—dielectric—electrode material B—without providing any lateral structure, differs from the hitherto customary stacking order, i.e. dielectric— laterally structured electrode material. As a result of the layer structure in accordance with the invention, all electrode layers which, at a later stage, will be contacted on the "right" side of the component, are made of a material which differs from that of all electrode layers which will be contacted on the "left" side of the component. The electrodes are homogeneously provided on the entire surface area of the electric layer; thus, pre-structuring of the electrode layers in accordance with the lateral dimensions of the future multilayer capacitors does not take place.

The stacking operation is followed by the division into preforms for the individual components, whereafter a selective, side-dependent electrode treatment is carried out and, finally, the formation of the contacts for the electrodes takes place.

The division into individual components can be carried out in known manner, for example, by notching and breaking or sawing, or by similar processes. In said division operation, blanks of multilayer capacitors are formed of which all electrode layers extend up to the surfaces of the four side faces. The essential difference with respect to the conventional manufacturing method is that the material of the electrodes to be insulated at an end face differs from the material of all electrodes to be contacted at said end face.

In accordance with the invention, first ceramic green plates are manufactured whose entire surface area is subsequently homogeneously coated with the electrode material A or the electrode material B in accordance with known thin-film techniques, such as vapor deposition, sputtering or electrochemical coating. In a very advantageous embodiment, also the dielectric layers are provided by means of a thin-film process, for example, laser or plasma-activated CVD (=Chemical Vapor Deposition). This method has the important advantage that, from the beginning, compact layers are deposited, so that the drying, binder burn-out and sintering steps can be dispensed with. Consequently, all compatibility problems which had to be taken into account during the co-sintering process of the metal/ceramic multilayer structure have ceased to exist. Another important advantage of this method is that thinner electrode layers and/or dielectric layers can be manufactured, so that higher volume capacitances can be achieved.

In addition, the peripheral regions of the multilayer capacitor which are not provided with inner electrodes can be reduced from, hitherto, 200 to 400 μm to 1 to 5 μm or even less. As a result, the size of the peripheral regions, which form an unusable dead volume, is no longer determined by geometric tolerances of the manufacturing process but instead only by the insulating properties of the dielectric materials used. Besides, in the multilayer capacitors manufactured in accordance with the conventional methods, lateral structuring of the electrode layers continually leads to fatal faults in the multilayer plates, which are always avoided in the manufacture of a laterally homogeneous multilayer plate in accordance with the invention.

A further advantage of the method in accordance with the invention is that the division into individual components does not take place until after sintering of the multilayer plate has been completed. This results in a greater flexibility of the manufacturing method as regards the dimensions of the individual components which are made from the plates. For example, multilayer capacitors of different sizes can be manufactured from one plate by cutting a multilayer capacitor of the desired size from the prefabricated stack of plates.

A detailed description of the manufacture of the multilayer capacitor is given, in which:

a) Manufacture of the stack of layers.

a1) Ceramic foils are manufactured and their entire surface is coated with an electrode paste by means of a screen-printing process, in a manner which is similar to that used in a conventional manufacturing method. A part of the foils must be homogeneously coated with the starting material for the electrode A, another part of the foils must be homogeneously coated with the starting material for the electrode B. As the multilayer plates typically have dimensions of 100×100 mm$^2$ and the formation of a uniform screen print on such large surfaces could lead to problems, one or more supporting structures must be provided in the screen-printing mass, which slightly reduce the part of the plates which can be used for components. Subsequently, the following processes are carried out in the same manner as in the conventional process, yet without the layers being staggered relative to each other and without observing lateral tolerances: stacking of the layers in the following order: electrode A-dielectric-electrode B, laminating, notching and breaking of the stacked layer, subsequently, drying, binder burn-out and sintering. Next, selective, side-dependent electrode treatment and formation of the end contacts take place.

a2) Instead of manufacturing the electrode layers by means of a thick-film technique (screen printing), the electrodes are provided on the ceramic foils by means of vacuum evaporation. This has the advantage that thinner electrode layers can be formed, which leads to a reduction of the dead volume of the components and hence to miniaturization. All other steps are the same as in (a1).

a3) Instead of using ceramic foils, the dielectric layers are deposited by means of a CVD (Chemical Vapor Deposition) process, preferably plasma or laser-activated, or by means of a laser-ablation process. The deposition of the electrode layers takes place in the same receptacle by means of a suitable thin-film method (vapor deposition, sputtering, CVD or similar methods). Preferably, all the layers deposited (electrode material A, dielectric, electrode material B) are compact. The individual deposition processes are repeated until a plate having the desired multilayer structure is obtained. The conventional process steps of drying, binder burn-out, sintering can be dispensed with. Next, the plate is divided into the precursors of the individual components, after which the electrodes are selectively treated.

b) Selective electrode treatment b1) For the electrode materials use is made of two different metals A and B having different oxidation potentials. An end face of the stack of layers, which end face is to be provided with one of the two end contacts, is immersed in an electrolytic solution, while such a potential is applied that the least noble one of the two electrode materials is dissolved out, whereas the other, noblest, electrode material is not attacked. After this step, a structure results in which the electrode layers alternately extend up to the surface or are situated in a trench below the surface. In order to achieve a sufficiently high level of insulation with respect to the future end contact of the multilayer capacitor and to planish the surface, the trenches are filled with a polymer having a high dielectric strength. This is achieved by applying a liquid monomer having a high wetting ability, which is cured by exposure to light. As the entire surface, including the electrode layers to be contacted, is now covered with said polymer, the surface is immersed in a bath which dissolves the polymeric surface. The exposure time is chosen to be such that the surface of the electrodes of the more noble metal will surely be exposed, whereas the trenches still have sufficiently thick insulation layers.

On both sides ("front side" and "back side"), where both types of electrodes are to be insulated, the above operation is repeated, yet with a higher potential, so that both the least noble and the noblest metal are dissolved at said locations.

In the next process step, the electrodes of the noblest metal on the opposite side of the capacitor must be dissolved out. This can be achieved in that on the side of the capacitor which has been treated first, only the electrodes of the noblest metal are subjected to a potential, as, on this side of the capacitor, the electrodes formed from the least noble metal are already insulated.

The subsequent formation of the end contacts for the "right" and "left" electrodes is carried out by means of a low-temperature process, for example vapor deposition, electroplating or a similar process, as the insulating polymers are not to be damaged by the use of a high-temperature baking process.

b2) Instead of an electrochemical, selective electrode treatment, solid-state reactions can be carried out in which only one of the electrode materials is selectively treated, for example oxidation of one of the metals. If a solid, insulating and dense reaction product (for example an oxide) is used, coating of the selectively treated end face with an insulating material is dispensed with because the reaction product provides the necessary insulation. In said case, the formation of the end contacts can also be achieved by subjecting the paste to a conventional baking process in which, in general, a temperature of 900° C. is used.

b3) Instead of subjecting only an end face to a selective treatment, it is possible to treat said end face together with the side faces in one operation.

b4) To insulate the selectively treated electrodes, use can be made of a highly insulating glass instead of a synthetic resin, which glass can be compatible with a baking process for the end contacts, and which can be baked together with said end contacts.

In summary, the method in accordance with the invention has the advantage that the hitherto necessary, time-consuming adjusting operations of the stratified layers can be dispensed with, that very small dimensions of the electrode-free peripheral regions are possible, that all electrode layers can be treated simultaneously in few process steps, and that, in accordance with the invention, thin-film techniques can be efficiently used.

We claim:

1. A method of manufacturing a multilayer ceramic electronic component which comprises alternately conductive layers and dielectric layers, and in which successive, conductive layers are alternately made from two different electrode materials and extend up to the surfaces of all four side faces of the substrate, characterized in that an end face of the stack of layers is immersed in an electrolytic solution and the least noble electrode material of the two electrode materials is electrochemically dissolved out, the resultant cavities are filled with a curable monomer, the curable monomer is polymerized the noblest one of the two electrode materials is exposed by removing polymerizate formed, thereon and a potential is applied to said noblest electrode material, which is so high as to enable said noblest electrode material at the other end face of the stack to be electrochemically dissolved out, the resultant cavities at the other end face are filled with a curable monomer, and outer electrodes are provided on opposite sides of the stack.

2. A method as claimed in claim 1, in which the conductive layers on the dielectric layers are formed by a thin-film process.

3. A method as claimed in claim 1, characterized in that said thin-film process is carried out by means of vapor deposition.

4. A method as claimed in claim 1, characterized in that the thin-film process is carried out by means of sputtering.

5. A method as claimed in claim 1, characterized in that the thin-film process is carried out by means of electrochemical coating.

6. A method as claimed in claim 1, characterized in that an end face of the stack of layers which is immersed in an electrolytic solution is subjected to a potential which dissolves out the least noble one of the two electrode materials, without attacking the noblest electrode material.

7. A method as claimed in claim 1, characterized in that the surface side of the stack of layers, out of which the least noble electrode material has been dissolved, is filled with an insulation material which is composed of polymers having a high dielectric strength or of glass, thereby forming a planar surface.

8. A method as claimed in any claim 1, characterized in that the electrodes of the noblest material on the side of the stack of layers which has been treated first are dissolved out, the electrodes formed from less noble metal already being insulated on this side.

9. A method as claimed in claim 1, characterized in that the multilayer ceramic electronic component is a multilayer capacitor.

10. A method as claimed in claim 1, characterized in that the multilayer ceramic electronic component is a multilayer, piezoelectric actuator.

11. A method as claimed in claim 2, characterized in that said thin-film process is carried out by means of vapor deposition.

12. A method as claimed in claim 2, characterized in that the thin-film process is carried out by means of sputtering.

13. A method as claimed in claim 2, characterized in that the thin-film process is carried out by electrochemical coating.

* * * * *